United States Patent
Yang et al.

(10) Patent No.: US 11,475,840 B2
(45) Date of Patent: Oct. 18, 2022

(54) ORGANIC LIGHT-EMITTING DISPLAY PANEL AND DISPLAY DEVICE

(71) Applicants: SHANGHAI TIANMA AM-OLED CO., LTD., Shanghai (CN); WUHAN TIANMA MICROELECTRONICS CO., LTD. SHANGHAI BRANCH, Shanghai (CN)

(72) Inventors: Shuai Yang, Shanghai (CN); Yue Li, Shanghai (CN); Zhi Liu, Shanghai (CN); Xingyao Zhou, Shanghai (CN)

(73) Assignees: WUHAN TIANMA MICROELECTRONICS CO., LTD., Wuhan (CN); WUHAN TIANMA MIOROLECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 16/910,078

(22) Filed: Jun. 24, 2020

(65) Prior Publication Data

US 2020/0320937 A1 Oct. 8, 2020

(30) Foreign Application Priority Data

Dec. 24, 2019 (CN) .......................... 201911350605.2

(51) Int. Cl.
*G09G 3/3258* (2016.01)
*H01L 27/32* (2006.01)
(Continued)

(52) U.S. Cl.
CPC ....... *G09G 3/3258* (2013.01); *H01L 27/3262* (2013.01); *G09G 2310/0286* (2013.01);
(Continued)

(58) Field of Classification Search
CPC ...... G09G 3/30; G09G 3/3233; G09G 3/3208; G09G 2320/045; G09G 2320/043
See application file for complete search history.

(56) References Cited

U.S. PATENT DOCUMENTS

| | | | |
|---|---|---|---|
| 2005/0184407 A1* | 8/2005 | Korenari | .............. G09G 3/3677 257/213 |
| 2018/0122298 A1* | 5/2018 | Lee | ..................... H01L 27/3262 |

(Continued)

FOREIGN PATENT DOCUMENTS

| | | |
|---|---|---|
| CN | 201893344 U | 7/2011 |
| CN | 102314829 A | 1/2012 |

(Continued)

OTHER PUBLICATIONS

Office Action of CN Patent Application No. 201911350605.2.

*Primary Examiner* — Yuzhen Shen
(74) *Attorney, Agent, or Firm* — Kilpatrick Townsend & Stockton LLP

(57) ABSTRACT

An organic light-emitting display panel and a display device are provided. The organic light-emitting display panel includes a control circuit. The control circuit includes a plurality of transistors. The plurality of transistors includes at least one first-type transistor, and each of the at least one first-type transistor has a channel width and a channel length, one of which is greater than five times the other one. Each of the at least one first-type transistor is a single-gate transistor.

7 Claims, 5 Drawing Sheets

(51) Int. Cl.
*H01L 27/12* (2006.01)
*H01L 29/786* (2006.01)

(52) U.S. Cl.
CPC ...... *H01L 27/1251* (2013.01); *H01L 27/1255* (2013.01); *H01L 29/78645* (2013.01); *H01L 29/78696* (2013.01)

(56) References Cited

U.S. PATENT DOCUMENTS

2018/0130424 A1* 5/2018 Gao .................... G09G 3/3291
2018/0151650 A1* 5/2018 Ha .................... H01L 29/78696
2018/0190745 A1* 7/2018 Udagawa .......... H01L 29/78675
2021/0408202 A1* 12/2021 Liu .................... H01L 27/3265

FOREIGN PATENT DOCUMENTS

| CN | 103489921 A | 1/2014 |
| CN | 104485071 A | 4/2015 |
| CN | 106875893 A | 6/2017 |
| CN | 107749276 A | 3/2018 |
| CN | 108682392 A | 10/2018 |

\* cited by examiner

ORGANIC LIGHT-EMITTING DISPLAY PANEL AND DISPLAY DEVICE

CROSS-REFERENCE TO RELATED APPLICATIONS

The present application claims priority to Chinese Patent Application No. 201911350605.2, filed on Dec. 24, 2019, the content of which is incorporated herein by reference in its entirety.

FIELD

The present disclosure relates to the field of display technologies, and in particular, to an organic light-emitting display panel and a display device.

BACKGROUND

An organic light-emitting display device is also called an organic light-emitting diode (OLED) display device, and it has advantages of lightness, thinness, large viewing angle and so on compared with a liquid crystal display device. A control circuit is provided in the organic light-emitting display panel, and the control circuit is configured to control a light-emitting element arranged in the organic light-emitting display panel through control of the circuit, to achieve a screen display. Therefore, the performance of the control circuit is related to a display effect, and how to improve the performance of the control circuit is a problem to be solved.

SUMMARY

In one embodiment of the present disclosure provides an organic light-emitting display panel including a control circuit. The control circuit includes a plurality of transistors, the plurality of transistors including at least one first-type transistor. Each of the at least one first-type transistor has a channel width and a channel length, one of which is greater than five times the other one, and each of the at least one first-type transistors is a single-gate transistor.

In another embodiment of the present disclosure provides a display device including the above organic light-emitting display panel.

BRIEF DESCRIPTION OF DRAWINGS

In order to more clearly illustrate the embodiments of the present disclosure, the accompanying drawings used in the embodiments are briefly described below. The drawings described below are merely a part of the embodiments of the present disclosure.

DESCRIPTION OF EMBODIMENTS

The embodiments of the present disclosure are described in details with reference to the drawings. It should be clear that the described embodiments are merely part of the embodiments of the present disclosure rather than all of the embodiments.

The terms used in the embodiments of the present disclosure are merely for the purpose of describing particular embodiments and not intended to limit the present disclosure. Unless otherwise noted in the context, the expressions "a" "an", "the" and "said" in a singular form used in the embodiments and appended claims of the present disclosure are also intended to represent a plural form.

Figure 1:
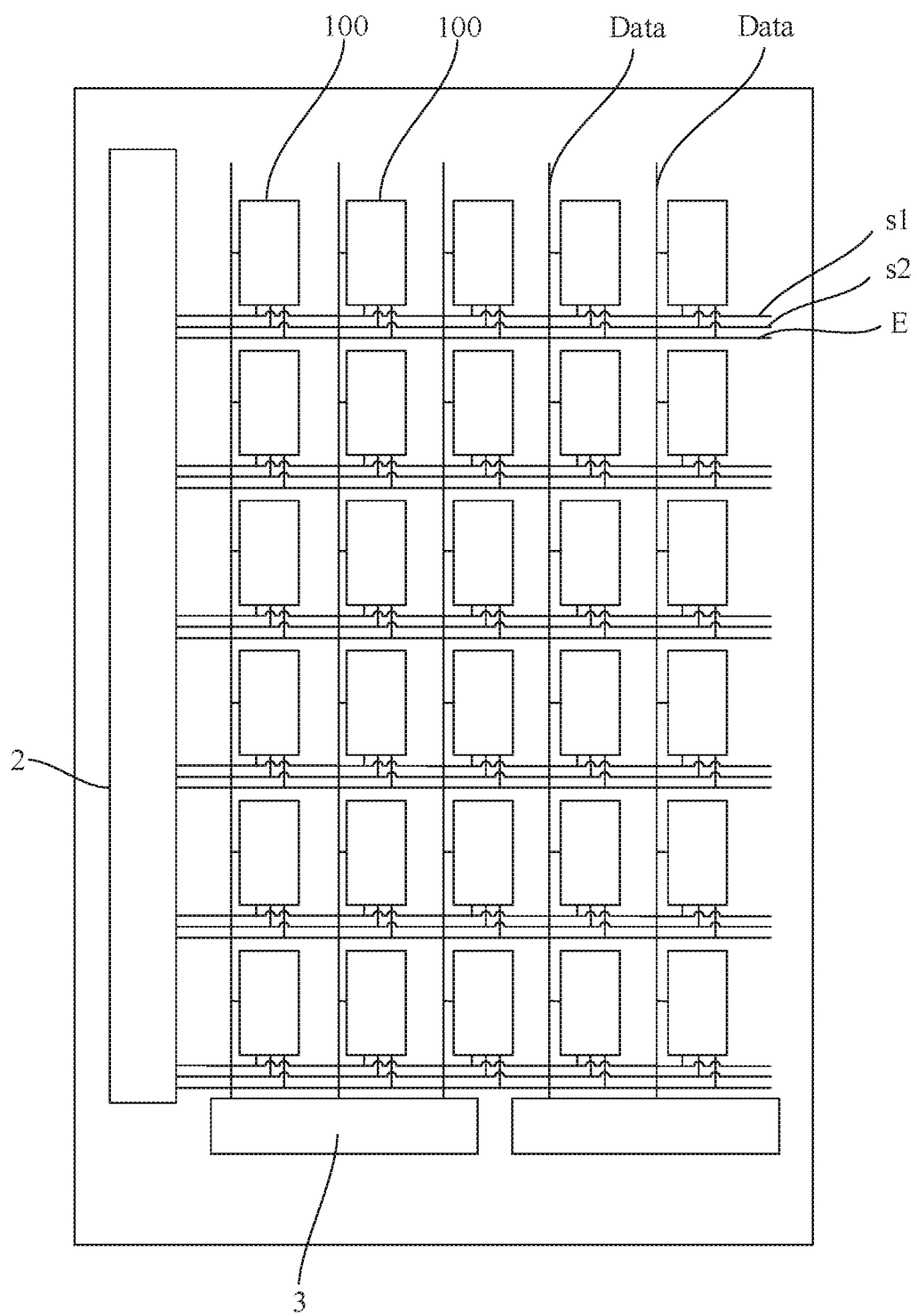
FIG. 1 illustrates a schematic diagram of an organic light-emitting display panel according to an embodiment of the present disclosure.
Figure 2:
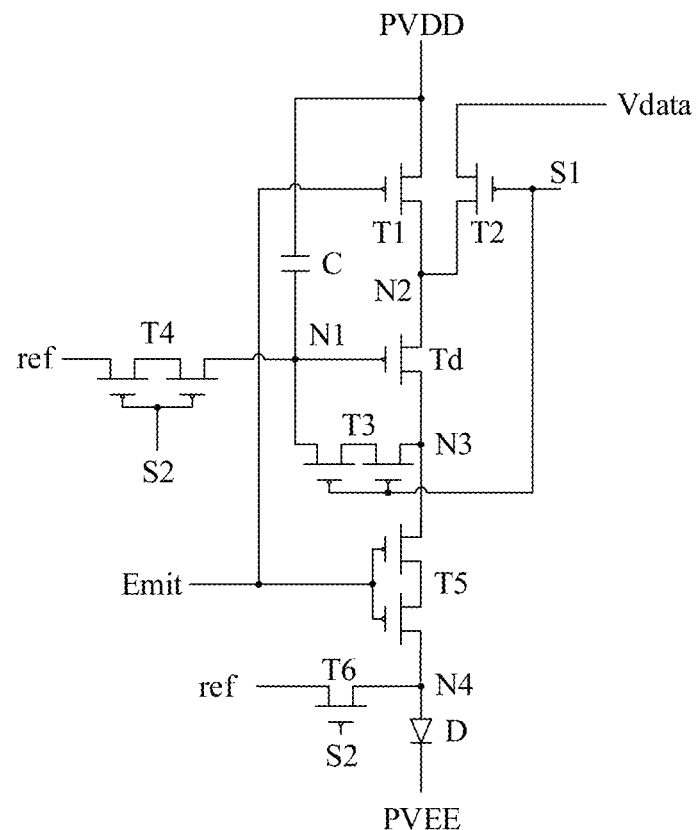
FIG. 2 illustrates a schematic diagram of an equivalent circuit of a pixel driving circuit provided in FIG. 1.

As shown in FIG. 1 and FIG. 2, FIG. 1 illustrates a schematic diagram of an organic light-emitting display panel according to an embodiment of the present disclosure, and FIG. 2 illustrates a schematic diagram of an equivalent circuit of a pixel driving circuit provided in FIG. 1. An embodiment of the present disclosure provides an organic light-emitting display panel including a control circuit. The control circuit includes multiple transistors, and the multiple transistors include at least one first-type transistor. One of a channel width and a channel length of each first-type transistor is greater than five times the other one (e.g., channel width>5*channel length, or channel length>5*channel width), and each first-type transistor is a single-gate transistor.

The organic light-emitting display panel includes the control circuit, and the organic light-emitting display panel display images through the control circuit. Functions of transistors arranged in the control circuit are different. According to the different functions of the transistors, parameters can have different requirements. For example, if one or some of the transistors need to have a relatively high response speed to meet requirements of the circuit, each of the at least one first-type transistor has a channel width and a channel length, one of which is greater than five times the other one. That is, the first-type transistor refers to a transistor of which one of the channel width and the channel length is greater than five times the other one. i.e., a transistor with a relatively high response speed. In an embodiment of the present disclosure, the first-type transistor is configured to be a single-gate transistor rather than a double-gate transistor. The single-gate transistor refers to a transistor which has only one gate and in which only one continuous channel is formed. The double-gate transistor refers to a transistor which has two identical gates and in which two channels connected in series are formed. For a single-gate transistor and a double-gate transistor that have same parameters, during operations of the transistors, due to structural characteristics of the single-gate transistor, its single channel of the single-gate transistor has a relatively fast turn-on speed or turn-off speed under a control of a single gate; for the double-gate transistor, due to an connection in series of the two channels, the channels of the entire element has a relatively slow turn-on speed or turn-off speed. For example, the organic light-emitting display panel shown in FIG. 1 includes multiple pixel driving circuits 100 arranged in an array. Each pixel driving circuit 100 corresponds to one sub-pixel and is configured to control a light-emitting element arranged in the sub-pixel to make the sub-pixel emit light to display. The pixel driving circuit 100 is a control circuit in the organic light-emitting display panel and has a driving transistor Td. The driving transistor Td is configured to generate a driving current, and the driving current is used to drive a corresponding light-emitting element to emit light. The driving transistor Td needs a relatively high response speed, so that it can be the first-type transistor in the embodiment of the present disclosure. The pixel driving circuit is only one of types of circuits in the organic light-emitting display panel, and a structure of a pixel driving circuit shown in FIG. 2 is only one of structures in the pixel driving circuit, and the structure of the control circuit is not limited in the embodiment of the present disclosure.

In the organic light-emitting display panel according to an embodiment of the present disclosure, the first-type transistor is configured to be the single-gate transistor, and one of the channel width and the channel length of the first-type transistor is greater than five times the other one. That is, by matching the width-to-length ratio of the channel and the type of the gate with each other, the first-type transistor has a relatively high response speed, which improves the performance of the circuit and thus improves a display effect.

In an embodiment, the channel width of each first-type transistor is greater than ten times the channel length of the first-type transistor, or the channel length of each first-type transistors is greater than five times the channel width of the first-type transistor.

In an embodiment, multiple transistors further include at least one second-type transistor in addition to the first-type transistor, and each of the at least one second-type transistor has a maximum cross-voltage greater than 50% of an average maximum cross-voltage of remaining transistors. Each second-type transistor is a double-gate transistor.

In an ideal state, no current will flow through the transistor that is in a turn-off state. However, due to process limitations of the element, etc., there is still a small amount of current flowing through the transistor that is in the turn-off state, and such current is called a leakage current. For a transistor manufactured using a Low Temperature Poly-Silicon (LTPS) process, its leakage current will be relatively large. In addition, according to the Ohm's law, a cross-voltage of a transistor is positively related to a leakage current of the transistor. The cross-voltage of the transistor refers to a voltage difference between two ends of the channel of the transistor, i.e., a difference between a voltage of a source and a voltage of a drain of the transistor. During the operation of the transistor, voltages of the source and the drain can change. That is, the cross-voltage of the transistor is a variable, and the maximum cross-voltage refers to a maximum difference between the voltage of the source and the voltage of the drain of the transistor. Therefore, for a transistor with a relatively large cross-voltage, its leakage current is also relatively large. That is, a transistor with a large cross-voltage is more likely to cause a decrease of a performance of the circuit due to a large leakage current. In an embodiment of the present disclosure, the second-type transistor is a transistor having a relatively large cross-voltage. Therefore, the second-type transistor is configured to be a double-gate transistor, and the leakage current is suppressed by the double-gate, to improve the performance of the circuit.

In an embodiment of the present disclosure, the average maximum cross-voltage is an arithmetic average value, which is obtained through dividing a sum of maximum cross-voltages of all remaining transistors by the number of all remaining transistors. In an embodiment of the present disclosure, the average maximum cross-voltage is a median average value, which is a middle value among the maximum cross-voltages of all remaining transistors that are arranged in order of magnitude, and if the number of data is even, an arithmetic average value of two data in the middle is taken as the median average value. That is, the average maximum cross-voltage of transistors can be determined by any one of the above two methods.

In an embodiment, the control circuit is a pixel driving circuit 100, and the first-type transistor is a driving transistor Td.

In one embodiment, the driving transistor Td is configured to generate a driving current through which the light-emitting element is driven to emit light, so it is ensured that the driving transistor Td has a relatively high response speed; in the other embodiment, in order to avoid a threshold drift affecting the driving current, the threshold voltage is usually sampled through making the current flow through the driving transistor Td to charge its control terminal. Therefore, it is ensured that the driving transistor has a relatively high response speed, so that the control terminal of the driving transistor Td can be charged to a required potential more quickly, to reduce the time required for the threshold voltage sampling, thereby increasing a scanning frequency.

In an embodiment, the pixel driving circuit 100 includes at least one control node switching transistor, each control node switching transistor is electrically connected to the control terminal of the driving transistor Td, and each control node switching transistor is a double-gate transistor.

The control terminal of the driving transistor Td is its gate, and the driving transistor Td generates a driving current under a voltage supplied to the control terminal. A value of the driving current is related to a voltage value supplied to the control terminal of the driving transistor Td, while the control node switching transistor is connected to the control terminal of the driving transistor Td, therefore when the leakage current of the control node switching transistor is relatively large, the driving current of the driving transistor Td will be abnormal, which cause a brightness of the light-emitting element being abnormal and thus exerting an adversely effect on the display effect. In the embodiment of the present disclosure, the control node switching transistor is configured as a double-gate transistor, and the characteristics of the double-gate structure are used to suppress the leakage current of the control node switching transistor, to improve the display failure caused thereby.

In an embodiment, the pixel driving circuit 100 includes a driving transistor Td, a first switching transistor T1, a second switching transistor T2, a third switching transistor T3, a fourth switching transistor T4, a fifth switching transistor T5, a sixth switching transistor T6, a light-emitting element D. and a capacitor C. The driving transistor Td includes a control terminal electrically connected to a first node N1, a first terminal electrically connected to a second node N2, and a second terminal electrically connected to a third node N3. The first switching transistor T1 includes a first terminal electrically connected to a first power voltage terminal PVDD, a second terminal electrically connected to the first terminal of the driving transistor Td, i.e., the second node N2, and a control terminal electrically connected to a light-emitting control terminal Emit. The second switching transistor T2 includes a first terminal electrically connected to a data voltage terminal Vdata, a second terminal electrically connected to the first terminal of the driving transistor Td, i.e., the second node N2, and a control terminal electrically connected to a first scanning signal terminal S. The third switching transistor T3 includes a first terminal electrically connected to the control terminal of the driving transistor Td, i.e., the first node N1, and a second terminal electrically connected to the second terminal of the driving transistor Td, i.e., the third node N3. The fourth switching transistor T4 includes a first terminal electrically connected to a reference voltage terminal ref, a second terminal electrically connected to the control terminal of the driving transistor Td, i.e., the first node N1, and a control terminal electrically connected to a second scanning signal terminal S2. The fifth switching transistor T5 includes a first terminal electrically connected to the second terminal of the driving transistor Td, i.e., the third node N3, a second terminal electrically connected to a fourth node N4, and a control terminal electrically connected to the light-emitting control terminal Emit. The sixth switching transistor T6 includes a first terminal electrically connected to the reference voltage terminal ref, and a second terminal connected to the second terminal of the fifth switching transistor T5, i.e., the fourth node N4, and a control terminal electrically connected to the second scanning signal terminal S2. The light-emitting element D includes a first terminal electrically connected to the second terminal of the sixth switching transistor T6, i.e., the fourth node N4, and a second terminal electrically connected to a second power voltage terminal PVEE. The capacitor C includes a first terminal electrically connected to the first power voltage terminal PVDD and a second terminal electrically connected to the control terminal of the driving transistor Td, i.e., the first node N1. The third switching transistor T3 is the control node switching transistor, and the fourth switching transistor T4 is the control node switching transistor.

Figure 3:
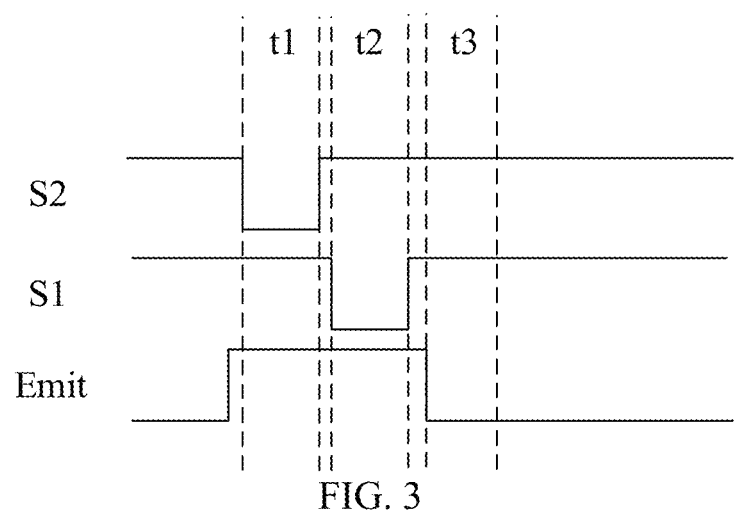
FIG. 3 illustrates a sequence signal diagram corresponding to the pixel driving circuit provided in FIG. 2.

FIG. 3 illustrates a sequence signal diagram corresponding to the pixel driving circuit in FIG. 3. As shown in FIG. 2 and FIG. 3, an operating process of the pixel driving circuit includes a reset phase t1, a data writing phase t2, and a light-emitting phase t3. In the reset phase t1, the first scanning signal terminal S1 and the light-emitting control terminal Emit provide a turn-off level to control the first switching transistor T1, the second switching transistor T2, the third switching transistor T3, and the fifth switching transistor T5 to be turned off, the second scanning signal terminal S2 provides a turn-on level to control the fourth switching transistor T4 and the sixth switching transistor T6 to be turned on, and a voltage on the reference voltage terminal ref is transmitted to the first node N1 and the fourth node N4 through the fourth switching transistor T4 and the sixth switching transistor T6 respectively to reset the first node N1 and the fourth node N4. In the data writing phase t2, the second scanning signal terminal S2 and the light-emitting control terminal Emit provide a turn-off level to control the fourth switching transistor T4, the sixth switching transistor T6, the first switching transistor T1 and the fifth switching transistor T5 to be turned off, the first scanning signal terminal S1 provides a turn-on level to control the second switching transistor T2 and the third switching transistor T3 to be turned on, a voltage on the data voltage terminal Vdata is transmitted to the first node N1 through the second switching transistor T2, the driving transistor Td, and the third switching transistor T3 to charge the first node N1, and when the first node N1 is charged until the driving transistor Td is caused to be turned off, the data writing is completed while the threshold voltage sampling of the driving transistor Td is achieved. In the light-emitting phase t3, the first scanning signal terminal S1 and the second scanning signal terminal S2 provide a turn-off level to control the second switching transistor T2, the third switching transistor T3, the fourth switching transistor T4, and the sixth switching transistor T6 to be turned off, the light-emitting control terminal Emit provides a turn-on level to control the first switching transistor T1 and the fifth switching transistor T5 to be turned on, the driving transistor Td generates a corresponding driving current according to a potential stored at the first node N1, and the driving current flows through the light-emitting element D to control a light-emitting brightness of the light-emitting element D. The driving transistor Td has a relatively large width-to-length ratio, requires a relatively high response speed, and is the first-type transistor. Therefore, regardless of the maximum cross-voltage between the source and the drain, it is configured to be the single-gate transistor. The fourth switching transistor T4 is connected between the reference voltage terminal ref and the first node N1, so the fourth switching transistor T4 is the control node switching transistor, and regardless of the maximum cross-voltage between the source and the drain, it is configured to be a double-gate transistor, to reduce the leakage current between the reference voltage terminal ref and the first node N1 during the data writing phase t2 and the light-emitting phase t3. The third switching transistor T3 is connected between the first node N1 and the third node N3, so the third switching transistor T3 is the control node switching transistor, and regardless of the maximum cross-voltage between the source and the drain, it is configured to be a double-gate transistor, to reduce the leakage current between the first node N1 and the third node N3 during the reset phase t2 and the light-emitting phase t3. For transistors other than the driving transistor Td, the fourth switching transistor T4 and the third switching transistor T3, the maximum cross-voltage of each transistor during operation can be tested or simulated. For example, in terms of the fifth switching transistor T5, the cross-voltage is 26V, and the average value of the maximum cross-voltages of remaining six transistors in the pixel driving current is 15V, (26−15)/15=73%>50%, then the fifth switching transistor T5 is configured as the double-gate transistor.

Figure 4:
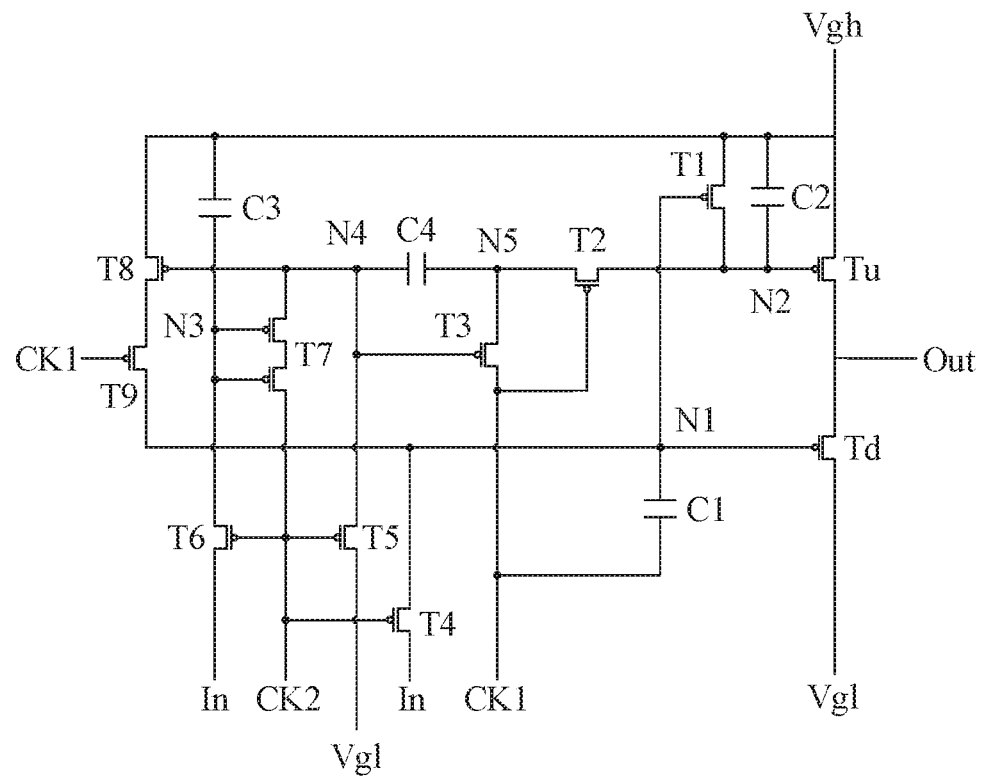
FIG. 4 illustrates a schematic diagram of an equivalent circuit of a shift register according to an embodiment of the present disclosure.

FIG. 4 illustrates a schematic diagram of an equivalent circuit of a shift register according to an embodiment of the present disclosure. In an embodiment, as shown in FIG. 4, the control circuit is a shift register, and the shift register includes a pull-up output transistor Tu and a pull-down output transistor Td. The pull-up output transistor Tu includes a first terminal electrically connected to a high-level voltage terminal Vgh and a second terminal connected to a shift register output terminal Out. The pull-down output transistor Td includes a first terminal electrically connected to the shift register output terminal Out and a second terminal electrically connected to a low-level voltage terminal Vgl. The pull-up output transistor Tu is the first-type transistor, and the pull-down output transistor Td is the first-type transistor.

In the shift register, the pull-up output transistor Tu is configured to transmit a high level supplied by the high-level voltage terminal Vgh to the shift register output terminal Out when the pull-up output transistor Tu is turned on, and the pull-down output transistor Td is configured to transmit a low level supplied by the low-level voltage terminal Vgl to the shift register output terminal Out when the pull-down output transistor Td is turned on. Therefore, it is ensured that the pull-up output transistor Tu and the pull-down output transistor Td are not be turned on at the same time, to prevent competition there between from causing an abnormal output. That is, the two can have a relatively high response speed to reduce competition. Therefore, the pull-up output transistor Tu and the pull-down output transistor Td each are configured as the first-type transistor, i.e., the single-gate transistor, and regardless of the maximum average cross-voltages of the pull-up output transistor Tu and the pull-down output transistor Td, both the pull-up output transistor Tu and the pull-down output transistor Td are configured as single-gate transistors.

In an embodiment, the shift register further includes a first capacitor C1, a second capacitor C2, a third capacitor C3, a fourth capacitor C4, a first transistor T1, a second transistor T2, a third transistor T3, a fourth transistor T4, a fifth transistor T5, a sixth transistor T6, a seventh transistor T7, an eighth transistor T8, and a ninth transistor T9. The first capacitor C1 includes a first terminal electrically connected to a first clock signal terminal CK1 and a second terminal electrically connected to the first node N1, and the first node N1 is electrically connected to a control terminal of the pull-down output transistor Td. The second capacitor C2 includes a first terminal electrically connected to the high-level voltage terminal Vgh and a second terminal electrically connected to the second node N2, and the second node N2 is electrically connected to a control terminal of the pull-up output transistor Tu. The third capacitor C3 includes a first terminal electrically connected to the high-level voltage terminal Vgh and a second terminal electrically connected to the third node N3. The fourth capacitor C4 includes a first terminal electrically connected to the fourth node N4 and a second terminal electrically connected to the fifth node N5. The first transistor T1 includes a first terminal electrically connected to the high-voltage terminal Vgh, a second terminal electrically connected to the second node N2, and a control terminal electrically connected to the first node N1. The second transistor T2 includes a first terminal electrically connected to the fifth node N5, a second terminal electrically connected to the second node N2, and a control terminal electrically connected to the first clock signal terminal CK1. The third transistor T3 includes a first terminal electrically connected to the fifth node N5, a second terminal electrically connected to the first clock signal terminal CK1, and a control terminal electrically connected to the fourth node N4. The fourth transistor T4 includes a first terminal electrically connected to the first node N1, a second terminal electrically connected to a shift register input terminal In, and a control terminal electrically connected to a second clock signal terminal CK2. The fifth transistor T5 includes a first terminal electrically connected to the fourth node N4, a second terminal electrically connected to the low-level voltage terminal Vgl, and a control terminal electrically connected to the second clock signal terminal CK2. The sixth transistor T6 includes a first terminal electrically connected to the third node N3, a second terminal electrically connected to the shift register input terminal In, and a control terminal electrically connected to the second clock signal terminal CK2. The seventh transistor T7 includes a first terminal electrically connected to the fourth node N4, a second terminal electrically connected to the second clock signal terminal CK2, and a control terminal electrically connected to the third node N3. The eighth transistor T8 includes a first terminal electrically connected to the high-level voltage terminal Vgh and a control terminal electrically connected to the fourth node N4. The ninth transistor T9 includes a first terminal electrically connected to the second terminal of the eighth transistor T8, a second terminal electrically connected to the first node N1, and a control terminal electrically connected to the first clock signal terminal CK1. The seventh transistor T7 is a double-gate transistor.

Figure 5:
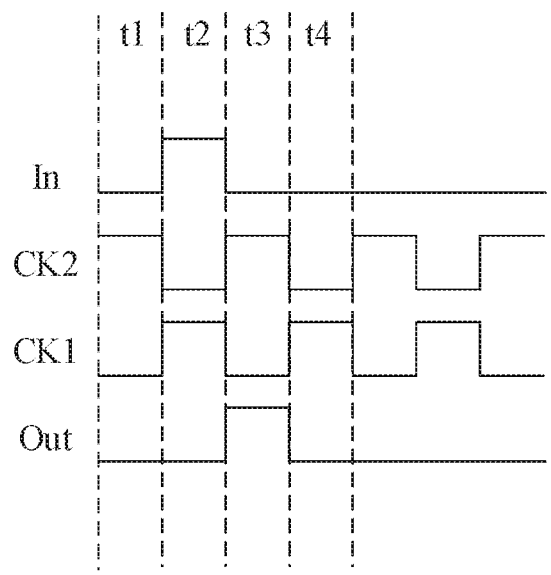
FIG. 5 illustrates a sequence signal diagram corresponding to the shift register provided in FIG. 4.
Figure 6:
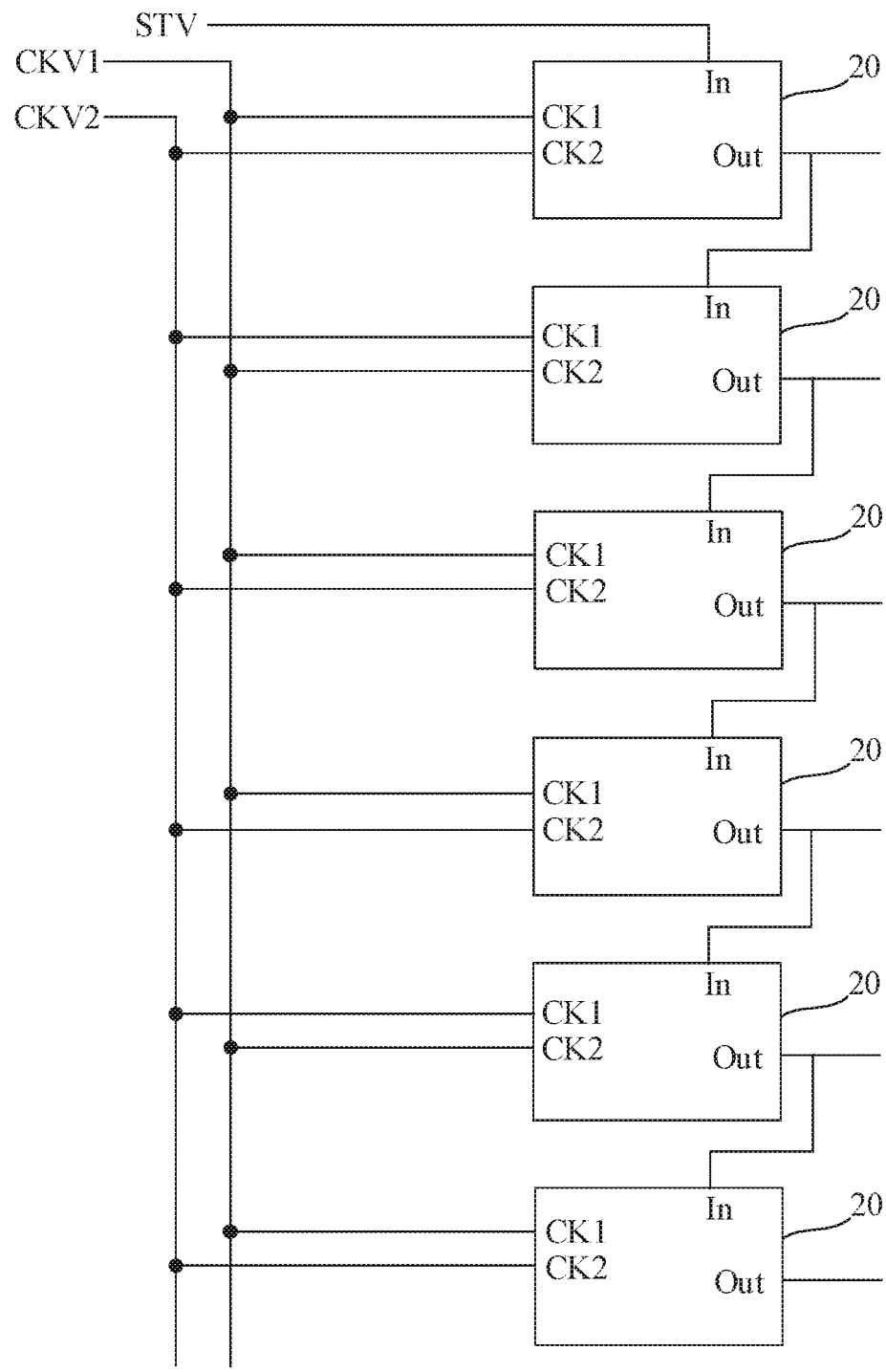
FIG. 6 illustrates a schematic diagram of an equivalent circuit of a scanning driving circuit provided in FIG. 1.

FIG. 5 illustrates a sequence signal diagram corresponding to the shift register provided in FIG. 4. As shown in FIG. 4 and FIG. 5, each transistor of the shift register provided in FIG. 4 is a P-type transistor. An operating process of the shift register includes a first phase t1, a second phase t2, a third phase t3, and a fourth phase t4. In the first phase t1, the shift register input terminal In and the first clock signal terminal CK1 provide a low level, the second clock signal terminal CK2 provides a high level, and the shift register output terminal Out outputs a low level. In the second phase t2, the shift register input terminal In and the first clock signal terminal CK1 provide a high level, the second clock signal terminal CK2 provides a low level, and the shift register output terminal Out outputs a low level. In the third phase t3, the shift register input terminal and the first clock signal terminal CK1 provide a low level, the second clock signal terminal CK2 provides a high level, and the shift register output terminal Out outputs a high level. In the fourth phase t4, the shift register input terminal In and the second clock signal terminal CK2 provide a low level, the first clock signal terminal CK1 provides a high level, and the shift register output terminal Out outputs a low level. During the entire working process of the shift register, the high-level voltage terminal Vgh provides a high level continuously, and the low-level voltage terminal Vgl provides a low level continuously. The shift register shifts a signal at the shift register input terminal In and then outputs it, to form a signal at the shift register output terminal. That is, a high-level pulse in the second phase t2 is shifted to a high-level pulse in the third phase 3 and output, to implement the function of the shift register. FIG. 6 illustrates a schematic diagram of an equivalent circuit of a scanning driving circuit provided in FIG. 1. Multiple pixel driving circuits 100 arranged in an array are provided in FIG. 1. One first scanning signal line s1, one second scanning signal line s2, and one light-emitting control signal line E are arranged corresponding to the pixel driving circuits 100 arranged in each row, and one data line Data are arranged corresponding to the pixel driving circuits 100 arranged in each column. In each pixel driving circuit 100, the first scanning signal terminal S1 is electrically connected to a corresponding first scanning signal line s1, the second scanning signal terminal S2 is electrically connected to a corresponding second scanning signal line s2, the light-emitting control terminal Emit is electrically connected to a corresponding light-emitting control signal line E, and the data voltage terminal Vdata is electrically connected to a corresponding data line Data. The first scanning signal line s1, the second scanning signal line s2, and the light-emitting control signal line E are electrically connected to the scanning driving circuit 2. The scanning driving circuit 2 is configured to generate a scanning signal to achieve progressive scanning of the pixel driving circuit 100. For example, the scanning driving circuit 2 includes multiple shift registers 20 arranged in cascade, and the output terminals of the multiple shift registers 20 respectively correspond to multiple rows of the pixel driving circuits 100, for providing corresponding scanning signals for, for example, the first scanning signal line s1, the second scanning signal line s2, or the light-emitting control signal line E. The scanning driving circuit 2 includes a first clock signal line CKV1 and a second clock signal line CKV2. The first clock signal line CVK1 is electrically connected to the first clock signal terminals CK1 of the shift registers 20 arranged in odd-numbered rows and to the second clock signal terminals CK2 of the shift registers 20 arranged in even-numbered rows. The second clock signal line CKV2 is electrically connected to the second clock signal terminals CK2 of the shift registers 20 arranged in the odd-numbered rows and to the first clock signal terminals CK1 of the shift registers 20 arranged in the even-numbered rows. An input terminal In of the shift registers arranged in the first row are electrically connected to an initial signal line STV. Except the shift registers 20 arranged in the first row, shift register input terminals In of the shift registers 20 arranged in each row are electrically connected to the shift register output terminal Out arranged in a previous row. In this way, the turn-on level can be output line by line through a cascaded manner. For example, when the shift registers 20 arranged in the first row output the turn-on level, the shift registers 20 arranged in other rows output a turn-off level, that is, to control the pixel driving circuits 100 arranged in the first row to perform data writing in response to the turn-on level. The shift registers 20 arranged in the second row output the turn-on level, and the shift registers 20 in the other rows output the turn-off level, that is, to control the pixel driving circuits 100 arranged in the second row to perform data writing. By analogy, progressive scanning can be performed. In the circuit structure of the shift register shown in FIG. 4, it is determined that the seventh transistor T7 is a second-type transistor, so the seventh transistor 17 is configured as a double-gate transistor.

Figure 7:
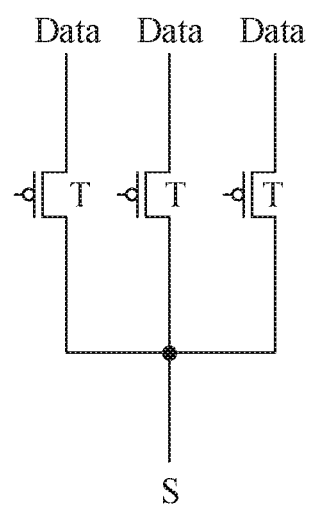
FIG. 7 illustrates a schematic diagram of an equivalent circuit of a multiplexer according to an embodiment of the present disclosure.

FIG. 7 illustrates a schematic diagram of an equivalent circuit of a multiplexer according to an embodiment of the present disclosure. In an embodiment, as shown in FIG. 1 and FIG. 7, the control circuit above is a multiplexer 3.

The display panel can be provided with multiple multiplexers 3. For example, every three data lines Data are divided into one group, and each group corresponds to one multiplexer 3. Each multiplexer 3 includes three switching transistors T. A first terminal of each switching transistor T is electrically connected to a corresponding data line Data, and a second terminal of the switching transistor T is electrically connected to a source signal line S. Since the number of the data lines Data in the display panel is relatively large, while the number of pins of a driving chip is limited, the multiplexer 3 can be provided between the driving chip and the data line Data to use relatively few pins of the driving chip to provide data signals for a relatively large number of the data lines Data. For example, in the structure shown in FIG. 7, the source signal line S is electrically connected to a same pin of the driving chip, and the time for writing data into the data line Data is divided into three phases. In a first phase, a first switching transistor T is turned on, the other two switching transistors T are turned off, and the source signal line S is conductive with a first data line Data. In a second phase, a second switching transistor T is turned on, the other two switching transistors T are turned off, and the source signal line S is conductive with a second data line Data. In a third phase, the third switching transistor T is turned on, the other two switching transistors T are turned off, and the source signal line S is conductive with a third data line Data. By using the multiplexer 3, time-division multiplexing of a same source signal line S is achieved, thereby reducing the number of pins of the driving chip.

The structures of the multiplexer, the shift register, and the pixel driving circuit described above are all illustrated as exemplary, and the embodiments of the present disclosure does not limit the structure of these circuit.

Figure 8:
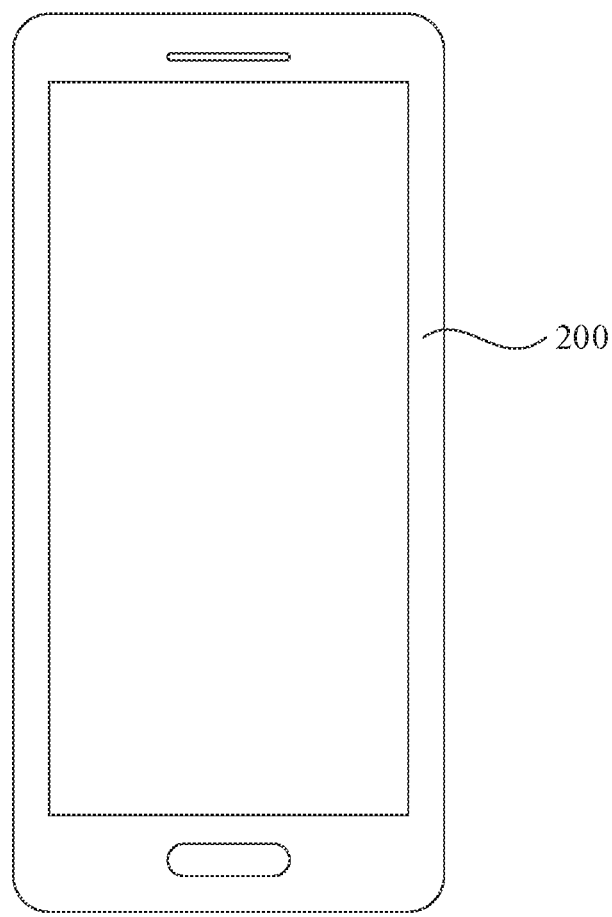
FIG. 8 illustrates a schematic diagram of a display device according to an embodiment of the present disclosure.

FIG. 8 illustrates a schematic diagram of a display device according to an embodiment of the present disclosure. As shown in FIG. 8, an embodiment of the present disclosure further provides a display device including the above-mentioned organic light-emitting display panel 200.

The structure and principle of the display panel 200 are similar to those described in the above embodiment and are not repeated herein. The display device can be any electronic device having a display function, such as a touch display screen, a mobile phone, a tablet computer, a notebook computer, or a television.

In the display device according to the embodiments of the present disclosure, the first-type transistor is configured as the single-gate transistor, and one of the channel width and the channel length of the first-type transistor is greater than five times the other one. That is, by matching the width-to-length ratio of the channel and the type of the gate with each other, the first-type transistor has a relatively high response speed, which improves the performance of the circuit and thus improves the display effect.

The above are only exemplary embodiments of the present disclosure and are not intended to limit the present disclosure. Any modifications, equivalents, improvements, etc., which are made within the spirit and principles of the present disclosure, should be included in the protection scope of the present disclosure.

What is claimed is:

1. An organic light-emitting display panel, comprising:
a control circuit comprising a plurality of transistors, the plurality of transistors comprising seven transistors, the seven transistors comprising four single-gate transistors and three double-gate transistors, the four single-gate transistors comprising at least one first-type transistor, and each of the three double-gate transistors being a second-type transistor,
wherein each of the at least one first-type transistor has a channel width and a channel length, one of which is greater than five times the other one, and each of the at least one first-type transistor is a single-gate transistor;
wherein at least two of the four single-gate transistors have different maximum cross-voltages, and each of the three second-type transistors has a maximum cross-voltage greater than 50% of an average maximum cross-voltage of six remaining transistors of the seven transistors except the second-type transistor; and
wherein the average maximum cross-voltage is an arithmetic average value that is obtained through dividing a sum of maximum cross-voltages of the remaining transistors by a number of the remaining transistors; or the average maximum cross-voltage is a median average value that is a middle value among the maximum cross-voltages of the remaining transistors that are arranged in order of magnitude, and the median average value is an arithmetic average value of two of the maximum cross-voltages of the remaining transistors in the middle if a number of the maximum cross-voltages of the remaining transistors is even.

2. The organic light-emitting display panel according to claim 1, wherein the channel length is greater than five times the channel width.

3. The organic light-emitting display panel according to claim 1, wherein the control circuit is a pixel driving circuit, and each of the at least one first-type transistor is a driving transistor.

4. The organic light-emitting display panel according to claim 3, wherein the pixel driving circuit comprises at least one control node switching transistor, each of the at least one control node switching transistor is electrically connected to a control terminal of the driving transistor, and each of the at least one control node switching transistor is a double-gate transistor.

5. The organic light-emitting display panel according to claim 4, wherein the plurality of seven transistors comprises:
- a first switching transistor comprising a first terminal electrically connected to a first power voltage terminal, a second terminal electrically connected to a first terminal of the driving transistor, and a control terminal electrically connected to a light-emitting control terminal;
- a second switching transistor comprising a first terminal electrically connected to a data voltage terminal and a second terminal electrically connected to the first terminal of the driving transistor;
- a third switching transistor being one of the at least one control node switching transistor and comprising a first terminal electrically connected to the control terminal of the driving transistor and a second terminal electrically connected to a second terminal of the driving transistor;
- a fourth switching transistor being one of the at least one control node switching transistor and comprising a first terminal electrically connected to a reference voltage terminal and a second terminal electrically connected to the control terminal of the driving transistor;
- a fifth switching transistor comprising a first terminal electrically connected to the second terminal of the driving transistor and a control terminal electrically connected to the light-emitting control terminal; and
- a sixth switching transistor comprising a first terminal electrically connected to the reference voltage terminal and a second terminal connected to a second terminal of the fifth switching transistor; and
- wherein the pixel driving circuit further comprises a light-emitting element comprising a first terminal electrically connected to the second terminal of the sixth switching transistor and a second terminal electrically connected to a second power voltage terminal.

6. The organic light-emitting display panel according to claim 1, wherein the channel width is greater than ten times the channel length.

7. A display device, comprising:
an organic light-emitting display panel, comprising:
a control circuit comprising a plurality of transistors, the plurality of transistors comprising seven transistors, and the seven transistors comprising four single-gate transistors and three double-gate transistors, the four single-gate transistors comprising at least one first-type transistor, and each of the three double-gate transistors being a second-type transistors,
wherein each of the at least one first-type transistor has a channel width and a channel length, one of which is greater than five times the other one, and each of the at least one first-type transistor is a single-gate transistor;
wherein at least two of the four single-gate transistors have different maximum cross-voltages, and each of the three second-type transistors has a maximum cross-voltage greater than 50% of an average maximum cross-voltage of six remaining transistors of the seven transistors except the second-type transistor; and
wherein the average maximum cross-voltage is an arithmetic average value that is obtained through dividing a sum of maximum cross-voltages of the remaining transistors by a number of the remaining transistors; or the average maximum cross-voltage is a median average value that is a middle value among the maximum cross-voltages of the remaining transistors that are arranged in order of magnitude, and the median average value is an arithmetic average value of two of the maximum cross-voltages of the remaining transistors in the middle if a number of the maximum cross-voltages of the remaining transistors is even.

* * * * *